US 7,736,922 B2

(12) United States Patent
Sato

(10) Patent No.: US 7,736,922 B2
(45) Date of Patent: Jun. 15, 2010

(54) SEMICONDUCTOR LASER ELEMENT AND METHOD OF FABRICATION THEREOF

(75) Inventor: Yoshifumi Sato, Kanagawa (JP)

(73) Assignee: Sony Corporation, Tokyo (JP)

( * ) Notice: Subject to any disclaimer, the term of this patent is extended or adjusted under 35 U.S.C. 154(b) by 186 days.

(21) Appl. No.: 11/465,621

(22) Filed: Aug. 18, 2006

(65) Prior Publication Data
US 2006/0281327 A1 Dec. 14, 2006

Related U.S. Application Data

(62) Division of application No. 10/762,696, filed on Jan. 22, 2004, now Pat. No. 7,133,430.

(30) Foreign Application Priority Data

Jan. 23, 2003 (JP) ............... P2003-014451

(51) Int. Cl.
H01L 21/00 (2006.01)
(52) U.S. Cl. ............... 438/29; 257/E21.086
(58) Field of Classification Search .......... 438/29, 438/31, 46, 47; 257/E21.085, E21.086, E21.155
See application file for complete search history.

(56) References Cited

U.S. PATENT DOCUMENTS

| 4,230,997 | A | * | 10/1980 | Hartman et al. | .......... 372/45.01 |
| 5,374,328 | A | * | 12/1994 | Remba et al. | .......... 438/167 |
| RE36,185 | E | * | 4/1999 | Remba et al. | .......... 438/604 |
| 2002/0037022 | A1 | * | 3/2002 | Fukagai | .......... 372/46 |

FOREIGN PATENT DOCUMENTS

| JP | 5-121829 | 5/1993 |
| JP | 08-204281 | 8/1996 |
| JP | 08-264761 | 10/1996 |
| JP | 10-004238 | 1/1998 |
| JP | 2002-057406 | 2/2002 |
| JP | 2002-208732 | 7/2002 |

* cited by examiner

Primary Examiner—Lex Malsawma
(74) Attorney, Agent, or Firm—Sonnenschein Nath & Rosenthal LLP

(57) ABSTRACT

A semiconductor laser element having an advantageous vertical light confinement efficiency, a low threshold current and a low element resistance is provided. The semiconductor laser element has a substrate and a stacked structure formed thereon, where the stacked structure comprises a buffer layer, an n-$Al_{0.6}Ga_{0.4}As$ cladding layer, an n-$Al_{0.47}Ga_{0.53}As$ cladding layer, an active layer, a p-$Al_{0.47}Ga_{0.53}As$ first cladding layer, an $Al_{0.55}Ga_{0.45}As$ etching stop layer, a p-$Al_{0.47}Ga_{0.53}As$ second cladding layer, a p-$Al_{0.6}Ga_{0.4}As$ third cladding layer, and a p-GaAs contact layer. The second and third cladding layers, and the contact layer are formed as a stripe-patterned ridge, and serve as a current injection regions. Both lateral portions of the ridge are filled with an n-type current blocking layer and serve as non-current-injection regions. Because the cladding layers on the active-layer-section side have a refractive index larger than that of the cladding layers disposed outward thereof, light leaked from the active layer section can efficiently be confined within the cladding layers on the active-layer-section side.

9 Claims, 13 Drawing Sheets

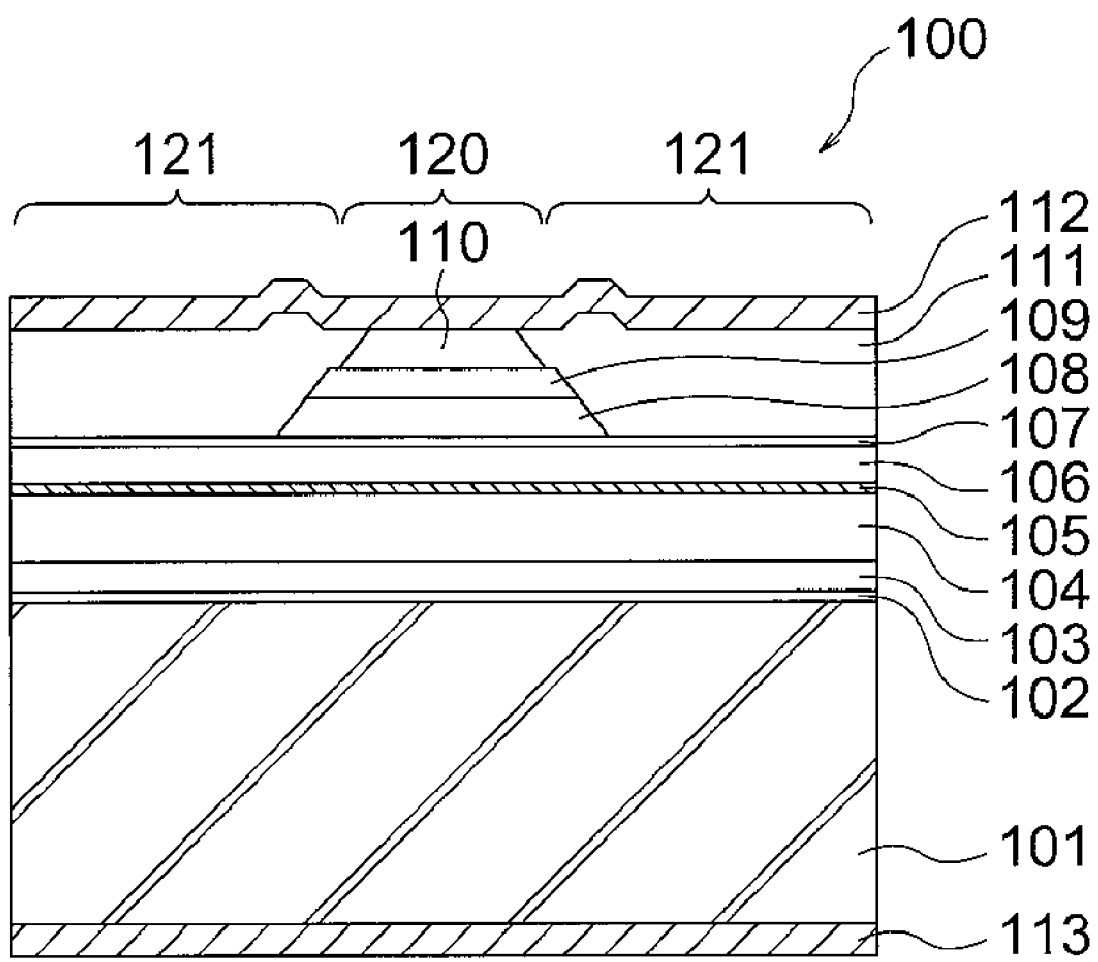

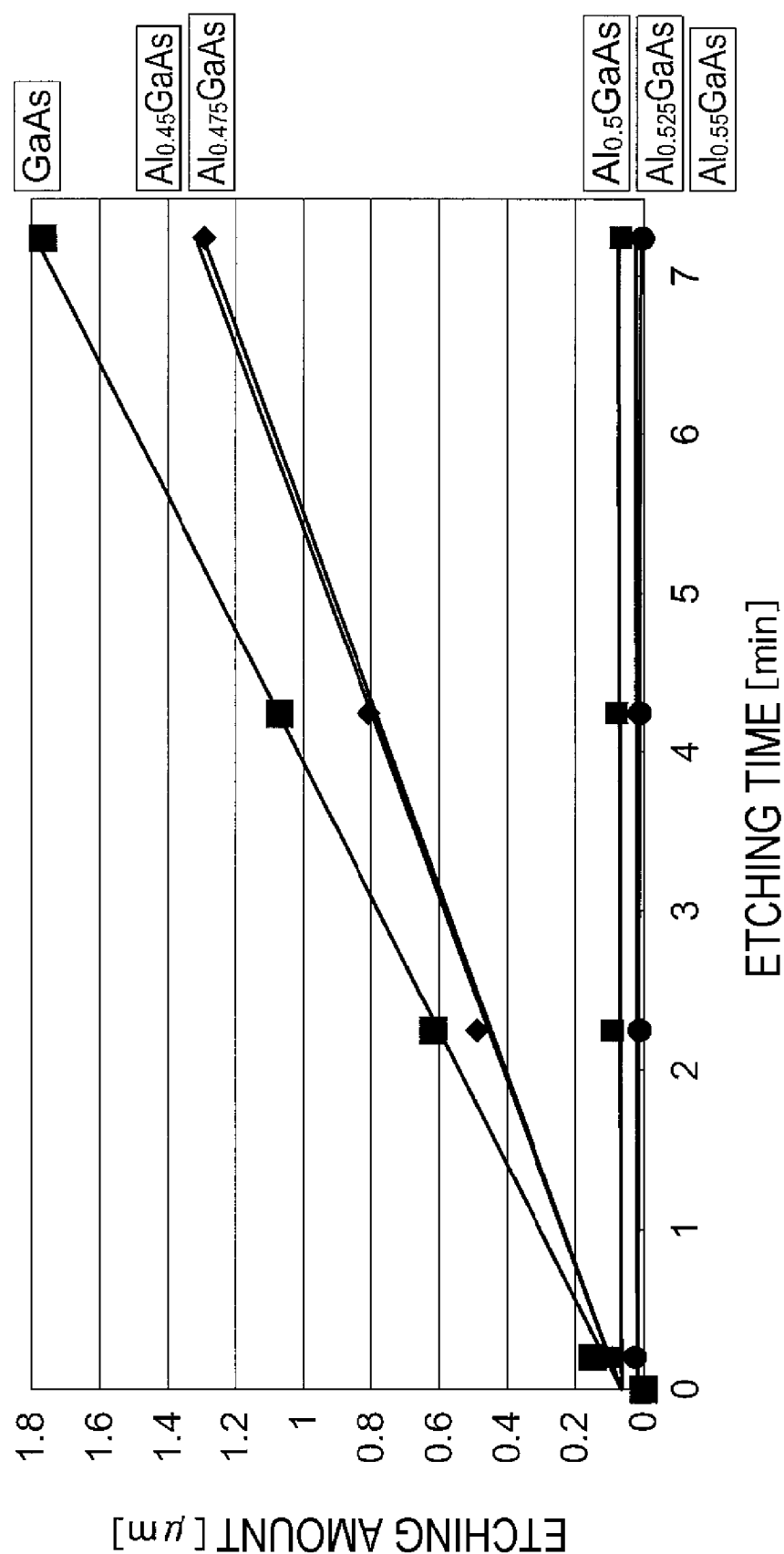

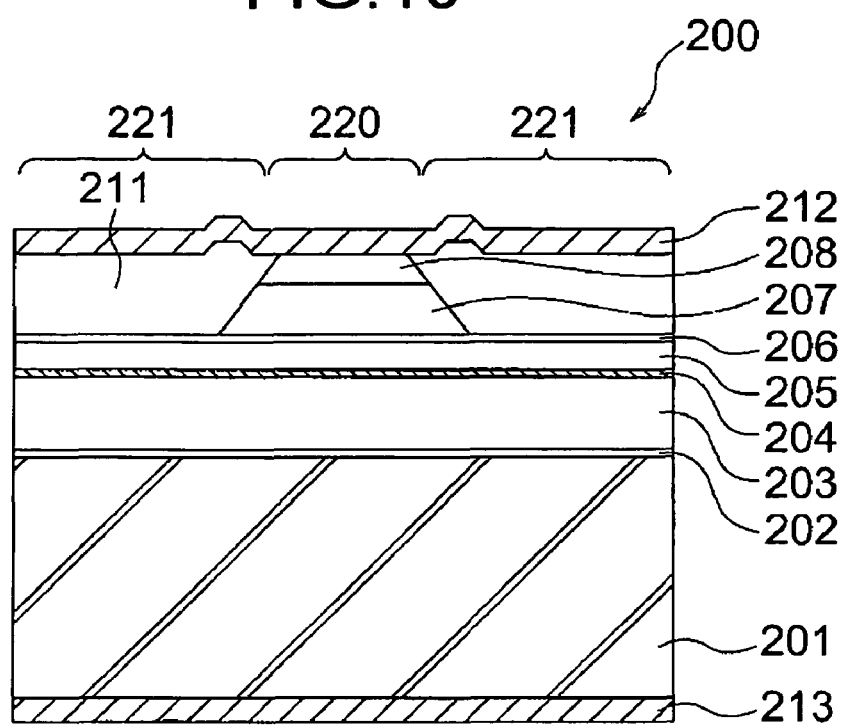
Prior Art FIG.10

Prior Art

SEMICONDUCTOR LASER ELEMENT AND METHOD OF FABRICATION THEREOF

RELATED APPLICATION DATA

This application is a divisional of U.S. patent application Ser. No. 10/762,696, filed Jan. 22, 2004, now U.S. Pat. No. 7,133,430 the entirety of which is incorporated herein by reference to the extent permitted by law. The present invention claims priority to Japanese patent application No. 2003-014451 filed in the Japanese Patent Office on Jan. 23, 2003, the entirety of which also is incorporated by reference herein to the extent permitted by law.

BACKGROUND OF THE INVENTION

1. Field of the Invention

The present invention relates to a semiconductor laser element and a method of fabricating the same, and more particularly to a AlGaAs-based ridge-stripe semiconductor laser element with low operational voltage and low element resistance, and a method of fabricating the element.

2. Description of the Related Art

In recent years, AlGaAs-based infrared wavelength semiconductor laser elements are used as light sources for reading devices, rewriting devices and initializers for optical disks. In particular, infrared high-output semiconductor laser elements of a broad-stripe type capable of oscillating lateral multimode laser light are expected as light sources for exciting solid lasers such as Nd:YAG and Nd:YVO$_4$ having absorption band of the crystals at around 808 nm. Also processing tools such as welders based on use of the infrared high-output semiconductor lasers are becoming increasingly popular.

In these fields, the high-output semiconductor laser elements have particularly been on demand for realizing a still higher light confinement efficiency and a still lower threshold current.

Referring to FIG. 10, a configuration of a conventional AlGaAs-base semiconductor laser element having a buried-ridge-type structure will be described. FIG. 10 is a cross-sectional view of a conventional AlGaAs-base semiconductor laser element having the buried-ridge-type structure.

As shown in FIG. 10, a conventional buried-ridge-type AlGaAs-base semiconductor laser element 200 includes a double-hetero-stacked structure formed on an n-GaAs substrate 201, where the stacked structure comprises an n-GaAs buffer layer 202, an n-Al$_{0.47}$Ga$_{0.53}$As cladding layer 203, an active layer section 204, a p-Al$_{0.47}$Ga$_{0.53}$As first cladding layer 205, an etching stop layer 206, a p-Al$_{0.47}$Ga$_{0.53}$As second cladding layer 207 and a p-GaAs contact layer 208, all of which are epitaxially grown sequentially in this order.

The p-second cladding layer 207 and p-contact layer 208 are formed as a ridge so as to constitute a current injection region 220. Both lateral sections of the ridge composing the current injection region 220 are filled with an n-GaAs current blocking layer 211 to thereby form non-current-injection regions 221.

A p-side electrode 212 is formed on the upper surfaces of the p-contact layer 208 and the n-GaAs current blocking layer 211, and an n-side electrode 213 is formed on the back surface of the n-GaAs substrate 201.

In the semiconductor laser element 200, filling of both lateral sections of the ridge-stripe-patterned current injection region 220 with a semiconductor material of a conduction type opposite to the current injection region 220 is successful in realizing narrowing of both the current and refractive-index-based waveguide at the same time.

It can thus be said that the aforementioned semiconductor laser element 200 has a configuration capable of effectively confining both injected carriers and laser light.

The following paragraphs will describe a method of fabricating the conventional semiconductor laser element 200 referring to FIG. 11A to FIG. 13F. FIGS. 11A and 11B, FIGS. 12C and 12D, and FIGS. 13E and 13F are cross-sectional views showing layer structures in the individual process steps in the fabrication of the conventional semiconductor laser element 200.

First, as shown in FIG. 11A, the n-GaAs buffer layer 202, the n-Al$_{0.47}$Ga$_{0.53}$As cladding layer 203, the active layer section 204, the p-Al$_{0.47}$Ga$_{0.53}$As first cladding layer 205, the etching stop layer 206, the p-Al$_{0.47}$Ga$_{0.53}$As second cladding layer 207, and the p-GaAs contact layer 208 are epitaxially grown sequentially in this order on the n-GaAs substrate 201 in the first epitaxial growth step by an organometallic vapor phase growth process such as the MOVPE process and MOCVD process, to thereby form a stacked structure 210 having a double hetero-structure.

In the epitaxial growth, Si, Se and so forth are used as the n-type dopant, and Zn, Mg, Be and so forth as the p-type dopant.

Next, as shown in FIG. 11B, an SiO$_2$ film 214 is formed on the top surface of the stacked structure 210, that is, the upper surface of the p-GaAs contact layer 208, by a CVD (Chemical Vapor Deposition) process or the like, and further on the SiO$_2$ film 214, a stripe-patterned resist mask 215 is formed by photolithography.

Next, the SiO$_2$ film 214 is mask-patterned with the resist mask 215, and the resist mask 215 is then removed, to thereby form an SiO$_2$ mask 214 on the p-GaAs contact layer 208, as shown in FIG. 12C.

Next, the p-GaAs contact layer 208 and the p-Al$_{0.47}$Ga$_{0.53}$As second cladding layer 207 are etched by wet etching technique under masking with the SiO$_2$ mask 214, to thereby form a ridge.

The etching is carried out using an etchant which is capable of completely removing the p-GaAs contact layer 208 and the p-Al$_{0.47}$Ga$_{0.53}$As second cladding layer 207, and having an etching selectivity enough to terminate the etching on the surface of the etching stop layer 206. This makes it possible to selectively remove the p-Al$_{0.47}$Ga$_{0.53}$As second cladding layer 207 without affecting the etching stop layer 206.

Next, as shown in FIG. 13E, the process advances to a second epitaxial step, where the n-GaAs current blocking layer 211 is grown on both lateral potions of the ridge. Because the SiO$_2$ mask 214 resides on the ridge, the GaAs current blocking layer 211 does not grow on the ridge.

Next as shown in FIG. 13F, the SiO$_2$ mask 214 is removed, the p-side electrode 212 is formed on the p-contact layer 208 and the n-GaAs current blocking layer 211, and the n-side electrode 213 is formed on the back surface of the n-GaAs substrate 201.

The aforementioned conventional semiconductor laser element 200 is obtained after all of the above-mentioned process steps.

SUMMARY OF THE INVENTION

The above-described semiconductor laser element 200, however, presents the following disadvantages as described below:

a first disadvantage is that the semiconductor laser element has a high operational voltage and high element resistance due to structural reasons; and a second drawback is that the fabrication processes involved are complicated and are costly again due to structural reasons.

A typical problem arises in association with the ridge formation. Assumption is made now that, in the process shown in FIG. 12D, the etching stop layer 206 is composed of $Al_mGa_{1-m}As$, and a hydrofluoric-acid-containing etchant is used in the etching for forming the stripe-patterned ridge.

Assuming now that the etching stop layer 206 composed of $Al_mGa_{1-m}As$ has no etching selectivity against the hydrofluoric-acid-containing etchant, the etching may proceed so as to penetrate the etching stop layer 206 to reach the p-$Al_{0.47}Ga_{0.53}As$ first cladding layer 205, and may even reach the active layer section 204 depending on occasions.

Because the etchrate attainable by the hydrofluoric-acid-containing etchant depends on the Al compositional ratio, it is found necessary to set the Al compositional ratio "m" so as to allow the etching to proceed through the p-$Al_{0.47}Ga_{0.53}As$ second cladding layer 207, but to terminate on the etching stop layer 206, so far as the hydrofluoric-acid-containing etchant is adopted.

Lowering the Al compositional ratio "m" so as to expand the etching selectivity between the p-$Al_{0.47}Ga_{0.53}As$ second cladding layer 207 and the etching stop layer 206, for example, undesirably raises a problem of increase in the element resistivity due to increase in the carrier recombination within the etching stop layer 206.

In place of the adjustment of the Al compositional ratio "m" of the etching stop layer 206, another possible strategy is such as raising the concentration of the hydrofluoric-acid-containing etchant aiming at increasing the etching selectivity between the p-$Al_{0.47}Ga_{0.53}As$ second cladding layer 207 and the etching stop layer 206. This, however, raises another problem of lowering in the etchrate of the p-$Al_{0.47}Ga_{0.53}As$ second cladding layer 207, which inhibits the etching.

Therefore, one cannot help saying that it is difficult to control the etching selectivity based on concentration of the hydrofluoric-acid-containing etchant.

Another problem of the hydrofluoric-acid-containing etchant resides in that it can etch also the $SiO_2$ mask 214. It is therefore necessary to determine the concentration of the hydrofluoric-acid-containing etchant so as to ensure the etching selectivity against the $SiO_2$ mask 214, and it is still also necessary to adjust the thickness of the $SiO_2$ mask 214. In short, use of the hydrofluoric-acid-containing etchant is labor-consuming.

There is proposed an alternative method in which GaInP is used for composing the etching stop layer 206, and a sulfuric-acid-containing etchant is adopted as the etchant in place of the hydrofluoric-acid-containing etchant, which may successfully increase the etching selectivity ratio, and thereby terminate the etching on the surface of the etching stop layer 206.

Adoption of GaInP for the etching stop layer 206, however, inevitably requires replacement of the previous As-containing furnace atmosphere with a P-containing furnace atmosphere, and lowering of the growth temperature in the furnace, in order to grow the GaInP etching stop layer in the first epitaxial growth step. After the GaInP etching stop layer was grown, the growth temperature in the furnace must be elevated again, the As-containing atmosphere must be recovered in order to grow the residual p-$Al_{0.47}Ga_{0.53}As$ second cladding layer 207, and the p-GaAs contact layer 208.

This makes the crystal growth process more complex, extends the operation time in the epitaxial growth process, and raises the costs.

It is also known that a high-output, broad-stripe-type semiconductor laser element using the GaInP etching stop layer may largely vary the geometry of the NFP (Near Field Pattern) as being affected by lattice distortion induced by the GaInP etching stop layer.

In view of such problems, Japanese Laid-Open Patent Publication No. 5-259574 proposes a method of forming the ridge by selectively etching the cladding layer using an etchant comprising an organic acid and hydrogen peroxide.

In other words, the patent publication describes that use of AlGaAs having an Al compositional ratio of 0.38 to 0.6 for the cladding layer, use of an AlGaAs layer having an Al compositional ratio of 0.6 or larger for the etching stop layer, and use of a specified etchant is successful in forming the ridge with a good reproducibility, and consequently in readily fabricating the semiconductor laser element.

The above-described patent publication discloses an example in which the cladding layer is composed of $Al_{0.5}Ga_{0.5}As$, a 0.06-µm-thick etching stop layer is composed of $Al_{0.6}Ga_{0.4}As$, and the specific etchant comprises a mixed solution of tartaric acid and an aqueous hydrogen peroxide solution.

In addition, this specific etchant can etch the $Al_{0.5}Ga_{0.5}As$ layer but cannot etch the $Al_{0.6}Ga_{0.4}As$ layer, so that the etching terminates upon exposure of the $Al_{0.6}Ga_{0.4}As$ layer, and this ensures the ridge formation with good reproducibility.

The patent publication also describes that use of the same AlGaAs layer both for the etching stop layer and the cladding layer makes it possible to grow the etching stop layer and the cladding layer under same growth conditions, so that only a control of the Al compositional ratio is successful in readily forming the cladding layer and the etching stop layer in a succeeding manner with an advantageous crystallinity.

It is also described that the light confinement efficiency can be raised because the etching stop layer is adjusted to have an Al compositional ratio larger than that of the cladding layer, and this makes it possible to provide a region having a refractive index smaller than that of the cladding layer.

The configuration of the semiconductor laser element disclosed in the patent publication, however, has the $Al_{0.6}Ga_{0.4}As$ etching stop layer having a refractive index smaller than that of the $Al_{0.5}Ga_{0.5}As$ cladding layer on the ridge side, and this results in a problem that the light generated in the active layer is undesirably pushed out towards the opposite side of the ridge, and consequently makes it difficult to raise the light confinement efficiency.

Another problem resides in that increase in the thickness of the $Al_{0.6}Ga_{0.4}As$ etching stop layer may be successful in improving the optical characteristics, but the $Al_{0.6}Ga_{0.4}As$ etching stop layer having a band gap energy larger than that of $Al_{0.5}Ga_{0.5}As$ composing the cladding layer also serves as a barrier against the carriers, and increase in the thickness thereof may result in increase in the threshold current.

The present invention has been conceived in view of the aforementioned problems in the prior art, and is aimed at providing an AlGaAs-base semiconductor laser element having a large vertical light confinement efficiency, a low threshold current and a low element resistance, and also at providing a method of fabricating the element.

A semiconductor laser element according to a preferred embodiment of the present invention (referred to as a first preferred embodiment, hereinafter) includes an AlGaAs-based ridge-stripe semiconductor laser element comprising an upper AlGaAs-base cladding layer and a lower AlGaAs-base cladding layer placing an active layer in between, wherein each of the upper AlGaAs-base cladding layer and the lower AlGaAs-base cladding layer further comprises two or more cladding layers including an AlGaAs-base first cladding layer close to the active layer, and an AlGaAs-base second cladding layer disposed outward on the AlGaAs-base first cladding layer relative to the active layer and having a larger Al compositional ratio and a smaller refractive index than the AlGaAs-base first cladding layer.

Because the first cladding layer of the semiconductor laser element according to this first preferred embodiment of the present invention has a refractive index larger than that of the second cladding layer, light leaked from the active layer can efficiently be confined within the first cladding layer, and this raises a light confinement factor of the semiconductor laser element.

More specifically, the first cladding layer and the second cladding layer are formed as an $Al_xGa_{1-x}As$ (0<x<1) layer and an $Al_yGa_{1-y}As$ (0<y<1) layer, respectively, where x<y.

A semiconductor laser element according to another preferred embodiment of the present invention (referred to as a second preferred embodiment, hereinafter) includes an AlGaAs-based ridge-stripe semiconductor laser element having a stacked structure formed on a GaAs substrate, the stacked structure having: an $Al_yGa_{1-y}As$ (0<y<1) cladding layer having a same conductivity type as the substrate, an $Al_xGa_{1-x}As$ (0<x<1) cladding layer having a same conductivity type as the substrate, a non-doped active layer section, an $Al_xGa_{1-x}As$ (0<x<1) first cladding layer having a conductivity type opposite to the substrate, an $Al_zGa_{1-z}As$ (0<z≦1) etching stop layer, an $Al_xGa_{1-x}As$ (0<x<1) second cladding layer having a conductivity type opposite to the substrate, an $Al_yGa_{1-y}As$ (0<y<1) third cladding layer having a conductivity type opposite to the substrate, and a GaAs contact layer having a conductivity type opposite to the substrate; wherein the second cladding layer, the third cladding layer and the contact layer are formed as a stripe-patterned ridge; and an Al compositional ratio "z" of the etching stop layer, an Al compositional ratio "x" of the first cladding layer and the second cladding layer, and an Al compositional ratio "y" of the third cladding layer satisfy the relations x<z and x<y, where a difference between "x" and "z" is set to 0.025 or more.

Because the Al compositional ratio "x" of the first cladding layer and the second cladding layer and the Al compositional ratio "z" are set so as to differ only by as small as 0.025 or more, the second preferred embodiment is successful in achieving, in addition to the effect of the the first preferred embodiment of the present invention, reduction in the element resistance in the etching stop layer, and consequently in realizing a semiconductor laser element having a small threshold current.

Provision of the etching stop layer as specified in the second preferred embodiment makes it possible to select an etchant having an etching selectivity between the etching stop layer and the second cladding layer in the ridge formation, and selection of a citric acid-containing etchant makes it possible to form the ridge by a simple process with a good reproducibility.

The etching stop layer of the second preferred embodiment has the same AlGaAs-base material with that for the cladding layer, and this makes it possible to epitaxially grow the first cladding layer, etching stop layer, second cladding layer, third cladding layer and contact layer in a succeeding manner.

In the etching of the second cladding layer in the second preferred embodiment, the thickness of the $Al_zGa_{1-z}As$ (0<z≦1) etching stop layer is adjusted within a range from 0.015 μm and 0.02 μm in the preposition that the etchant is chosen so as to ensure selectivity between the etching stop layer and the second cladding layer, which is typically a citric-acid-containing etchant.

The thickness of the etching stop layer is successful in reducing influences of the refractive index of the etching stop layer against the light generated in the active layer, and is less influential to the optical characteristics of the semiconductor laser element.

The thickness of the etching stop layer less than 0.015 μm results in only an insufficient effect as the etching stop layer, whereas the thickness exceeding 0.02 μm is unnecessary in view of exhibiting the effect of the etching stop layer, or rather results in a problem of increase in the threshold current.

In the formation of the ridge, it is also allowable to form a structure having the $Al_zGa_{1-z}As$ (0<z≦1) etching stop layer omitted therefrom, or it is still also allowable to adopt a structure having the ridge etched as deep as to reach the $Al_xGa_{1-x}As$ (0<x<1) first cladding layer having a conductivity type opposite to the substrate.

In the second preferred embodiment, the Al compositional ratio "x" may differ between the $Al_xGa_{1-x}As$ (0<x<1) first cladding layer and the $Al_xGa_{1-x}As$ (0<x<1) second cladding layer.

The $Al_zGa_{1-z}As$ (0<z≦1) etching stop layer may have the same Al compositional ratio with that of the $Al_yGa_{1-y}As$ (0<y<1) third cladding layer, so far as its Al compositional ratio is larger by 0.025 or more than that of the $Al_xGa_{1-x}As$ (0<x<1) second cladding layer.

Another preferred embodiment of the present invention includes a method of fabricating An AlGaAs-based ridge-stripe semiconductor laser element comprising the steps of forming a stacked structure on an active layer section, the stacked structure comprising an $Al_xGa_{1-x}As$ (0<x<1) first cladding layer, an $Al_zGa_{1-z}As$ (0<z≦1) etching stop layer, an $Al_xGa_{1-x}As$ (0<x<1) second cladding layer, an $Al_yGa_{1-y}As$ (0<y<1) third cladding layer, and a GaAs contact layer; and having Al compositional ratio "z" of the etching stop layer, Al compositional ratio "x" of the first cladding layer and the second cladding layer, and Al compositional ratio "y" of the third cladding layer satisfying the relations x<z and x<y, where a difference between "x" and "z" is set to 0.025 or more; and forming a stripe-patterned ridge by wet-etching the contact layer, the third cladding layer and the second cladding layer; wherein the ridge forming step further includes: a first etching step of wet-etching part of the contact layer, the third cladding layer, and the second cladding layer; and a second etching step of etching the residual portion of the second cladding layer up to the etching stop layer, by using an etchant comprising a mixed solution of an aqueous citric acid solution and an aqueous hydrogen peroxide solution.

In the method according to the preferred embodiment of the present invention, the third cladding layer and the GaAs contact layer, which are hard to be etched by the etchant which comprises a mixed solution of an aqueous citric acid solution and an aqueous hydrogen peroxide solution, are wet-etched in the first etching step typically by using a sulfuric-acid-containing etchant, and the residual section of the second cladding layer is then etched by using an etchant having an etching selectivity over the etching stop layer to thereby form the ridge.

The etching in the second etching step can be proceeded with an advantageous in-plane uniformity even if any non-uniformity should occur in the first etching step due to a poor in-plane etching uniformity, so that the semiconductor laser element successfully exempts from being varied in the characteristics.

According to the method of the preferred embodiment of the present invention, provision of the AlGaAs layer having thus-specified Al compositional ratio as the etching stop layer makes it possible to ensure a sufficient etching selectivity even if the etching stop layer is formed to as thin as 0.015 μm to 0.02 μm, and thereby facilitates the ridge formation.

According to the method of the preferred embodiment of the present invention in which the etching stop layer is composed of $Al_xGa_{1-z}As$ ($0<z\leqq1$) similarly to the cladding layer, it is no more necessary to alter the furnace temperature for growing the etching stop layer in the first epitaxial growth step, and this makes it possible to proceed epitaxial growth of all of the first cladding layer, etching stop layer, second cladding layer, third cladding layer and contact layer in a succeeding manner. In short, the method according to the preferred embodiment of the present invention is successful in readily forming a stacked structure of the semiconductor laser element within a short time, and in realizing the semiconductor laser element at low costs.

According to another preferred embodiment of the present invention, the stacked structure etched in the first etching step is transferred from the first etching step through the cleaning step to the second etching step without exposing it to the air and water. Transfer of the wafer without exposing it to the air and water can be accomplished typically by transferring the wafer to an inert gas atmosphere or to vacuum atmosphere.

This successfully prevents the wafer from being exposed to the air and water during the ridge formation process, realizes a fabrication process capable of suppressing natural oxidation of the wafer surface, and thus realizes a good reproducibility in the process without causing white clouding of the wafer and non-uniformity in the etching.

BRIEF DESCRIPTION OF THE DRAWINGS

The above and other objects, features and advantages of the present invention will become more apparent from the following description of the presently preferred exemplary embodiment of the invention taken in conjunction with the accompanying drawings, in which:

FIG. 1 is a cross-sectional view showing a configuration of a semiconductor laser element according to a preferred embodiment of the present invention;

FIG. 9 is a graph showing etchrates of $Al_xGa_{1-x}As$ layers using an etchant comprising an 11:1 mixed solution of citric acid monohydrate (50 wt % aqueous solution) and an aqueous hydrogen peroxide solution (31%);

FIG. 10 is a cross-sectional view showing a configuration of a conventional semiconductor laser element;

DETAILED DESCRIPTION OF THE PREFERRED EMBODIMENTS OF THE INVENTIONN

Figure 2A:
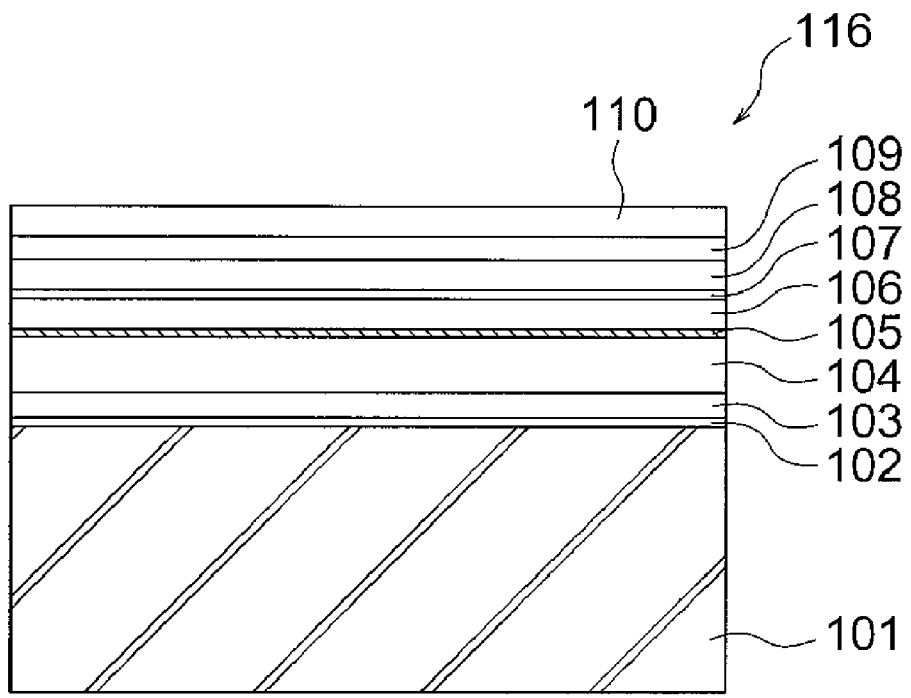
FIGS. 2A and 2B are cross-sectional views showing layer structures in the individual process steps in the fabrication of the semiconductor laser element according to a preferred embodiment of the present invention.

The following paragraphs will specifically describe preferred embodiments of the present invention in detail with reference to the attached drawings. It is to be understood that the film forming method, composition and thickness of the compound semiconductor layers and process conditions described in the preferred embodiments of the present invention below are none other than exemplary ones for the convenience of understanding of the present invention, and by no means limit the present invention.

Examples of Embodiments of the Semiconductor Laser Element

This example of embodiment relates to an example of semiconductor laser element according to a preferred embodiment of the present invention. FIG. 1 is a cross-sectional view showing a configuration of a semiconductor laser element according to such embodiment.

A semiconductor laser element 100 of this embodiment comprises a stacked structure formed on an n-GaAs substrate 101, where the stacked structure comprises an n-GaAs buffer layer 102, an n-$Al_{0.6}Ga_{0.4}As$ cladding layer 103, an n-$Al_{0.47}Ga_{0.53}As$ cladding layer 104, an active layer section 105, a p-$Al_{0.47}Ga_{0.53}As$ first cladding layer 106, an $Al_{0.55}Ga_{0.45}As$ etching stop layer 107, a p-$Al_{0.47}Ga_{0.53}As$ second cladding layer 108, a p-$Al_{0.6}Ga_{0.4}As$ third cladding layer 109, and a p-GaAs contact layer 110 stacked in this order.

The p-$Al_{0.47}Ga_{0.53}As$ second cladding layer 108, the p-$Al_{0.6}Ga_{0.4}As$ third cladding layer 109, and the p-GaAs contact layer 110 are formed as a stripe-patterned ridge so as to constitute a current injection region 120. Both side faces and both lateral portions are filled with an n-GaAs current blocking layer 111 to thereby form non-current-injection regions 121.

A p-side electrode 112 is formed on the upper surfaces of the p-GaAs contact layer 110, which forms the upper surface of the ridge, and the n-GaAs current blocking layer 111 and an n-side electrode 113 is formed on the back surface of the n-GaAs substrate 101.

As an example of this preferred embodiment, the thickness of the n-GaAs buffer layer 102 is set to 0.5 μm, the n-$Al_{0.6}Ga_{0.4}As$ cladding layer 103 to 1.0 μm, the n-$Al_{0.47}Ga_{0.53}As$ cladding layer 104 to 0.6 μm, the p-$Al_{0.47}Ga_{0.53}As$ first cladding layer 106 to 0.3 μm, the $Al_{0.55}Ga_{0.45}As$ etching stop layer 107 to 0.015 μm, the p-$Al_{0.47}Ga_{0.53}As$ second cladding layer 108 to 0.3 μm, the p-$Al_{0.6}Ga_{0.4}$As third cladding layer 109 to 1.0 μm, and the p-GaAs contact layer 110 to 0.5 μm.

The active layer section 105 of this example of preferred embodiment of the present invention is configured so as to have an SCH (Separated Confinement Heterostructure) which is composed as an optical waveguide layer including an optical guide layer, and is more specifically configured so as to have an SQW (Single Quantum Well) structure which comprises a 0.05-μm thick $Al_{0.3}Ga_{0.7}$As optical guide layer and a 0.01-μm thick $Al_{0.1}Ga_{0.9}$As active layer.

It is to be noted that configuration of the active layer section 105 is not limited thereto, allowing any other designs or configurations.

According to this example of preferred embodiment of the present invention, each of the upper and lower cladding layer disposed while placing the active layer section 105 in between respectively comprises two layers of an $Al_{0.6}Ga_{0.4}$As cladding layer and an $Al_{0.47}Ga_{0.53}$As cladding layer, where the cladding layers on the active-layer-section 105 side are composed of $Al_{0.47}Ga_{0.53}$As, and the outer cladding layers further sandwiching them are composed of $Al_{0.6}Ga_{0.4}$As.

In this configuration, the cladding layers disposed on the active-layer-section 105 side have a refractive index larger than that of the outer cladding layer, so that the light leaked from the light emitting layer section 105 can efficiently be confined in the cladding layers on the active-layer-section 105 side.

Figure 7:
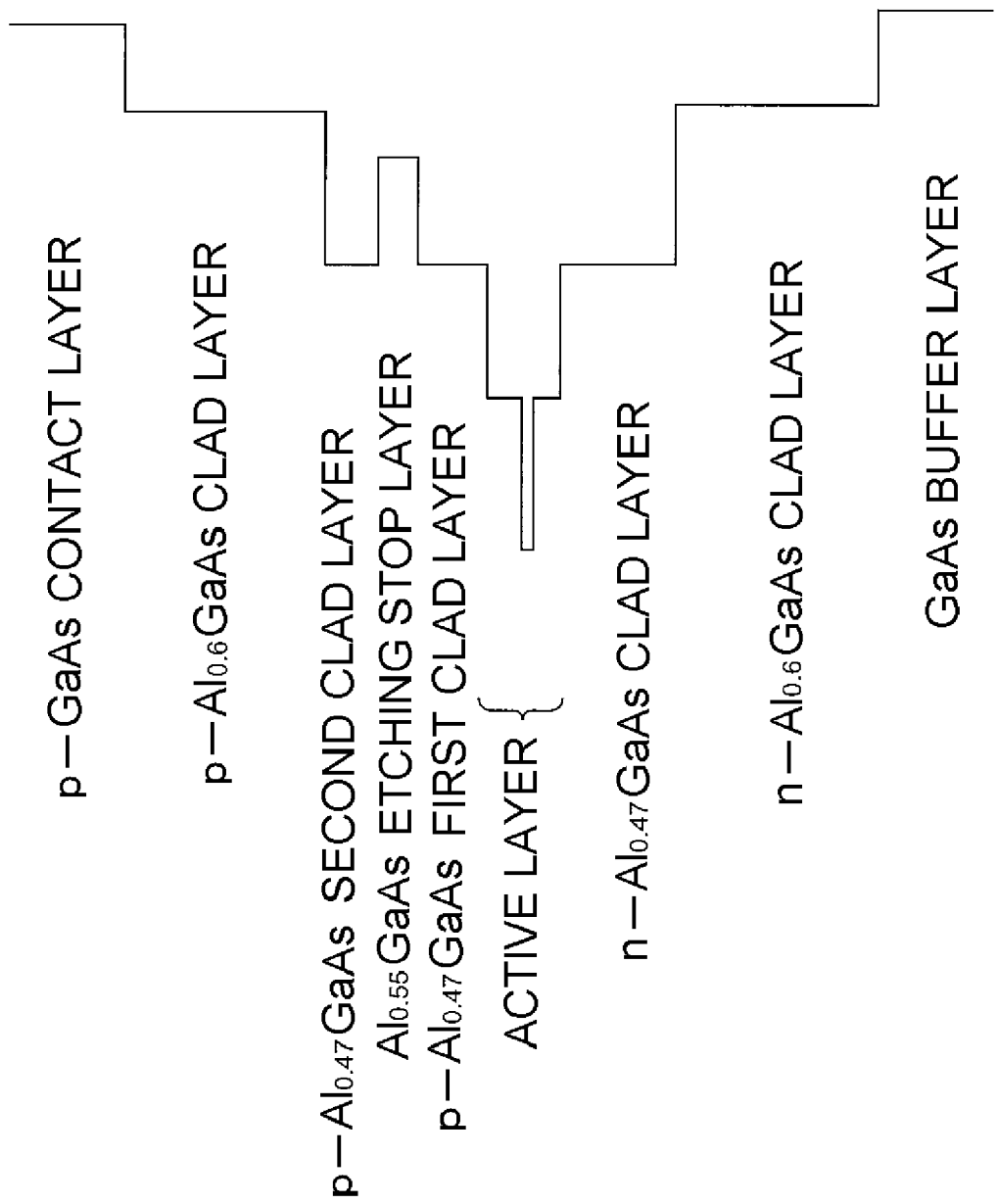
FIG. 7 is a drawing of energy levels of a layer structure of the semiconductor laser element according to a preferred embodiment of the present invention.

FIG. 7 is a drawing of energy levels of a layer structure of the semiconductor laser element 100 of this embodiment. The semiconductor laser element 100 has a light confinement factor of 3.2164%.

Figure 8:
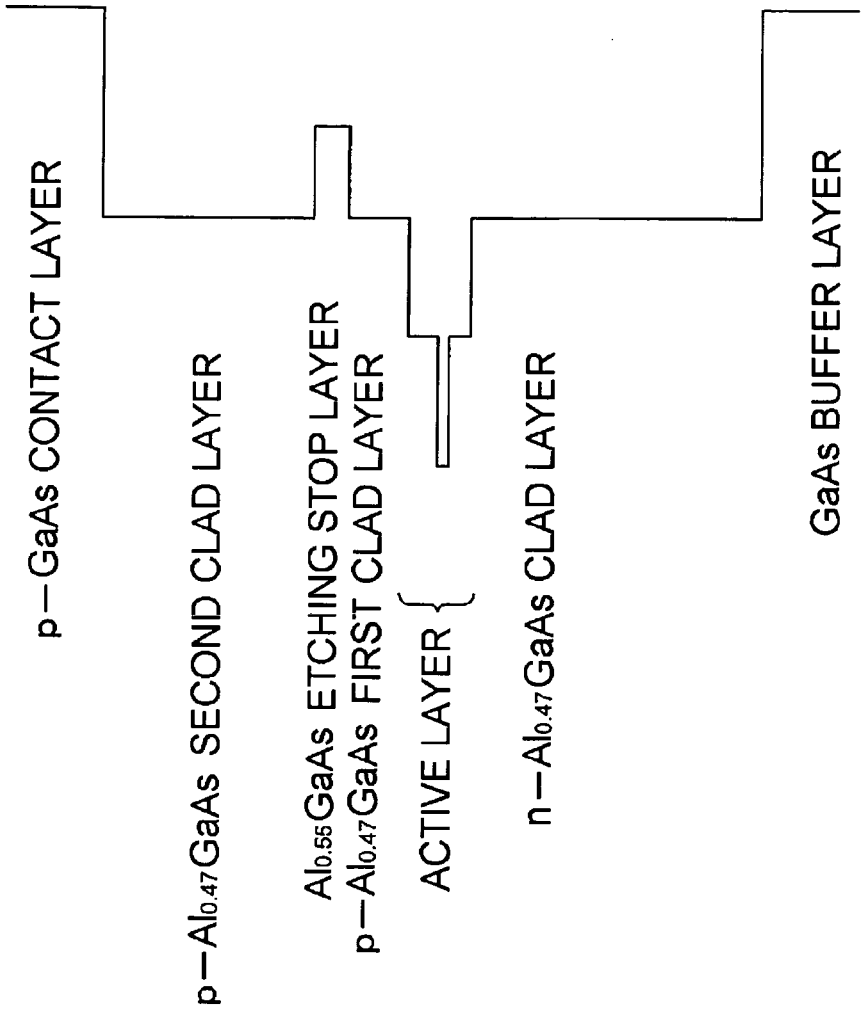
FIG. 8 is a drawing of energy levels of a layer structure of a conventional semiconductor laser element.
Figure 11A:
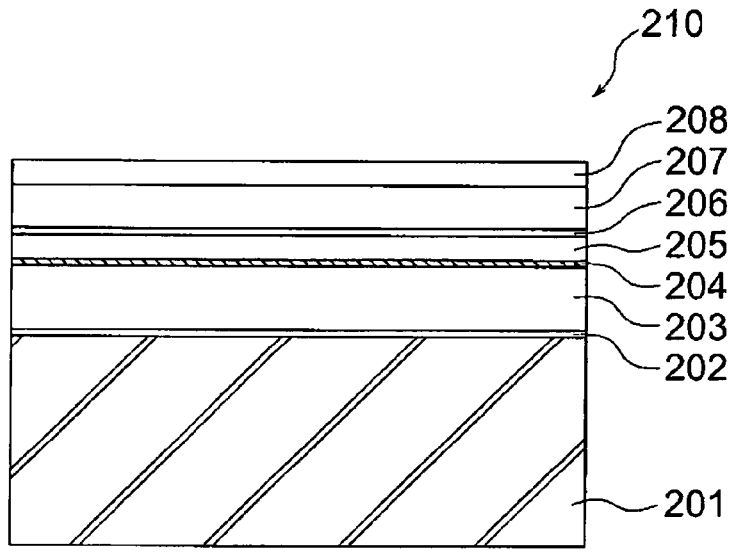
FIGS. 11A and 11B are cross-sectional views showing layer structures in the individual process steps in the fabrication of a conventional semiconductor laser element.
Figure 11B:
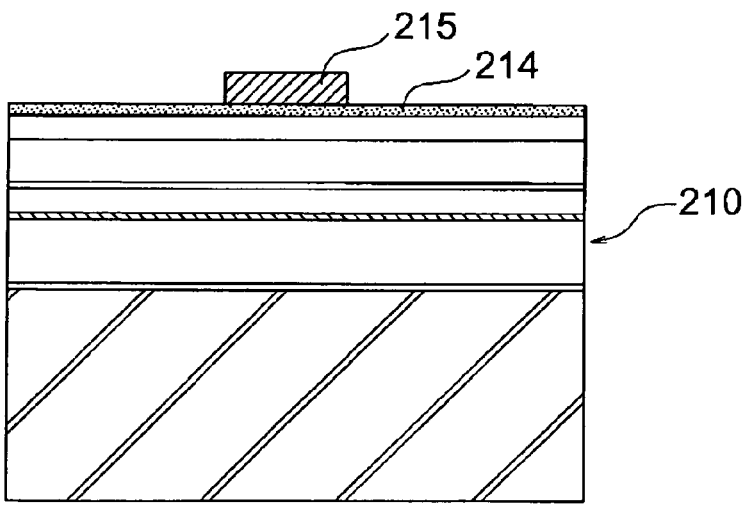
Figure 12C:
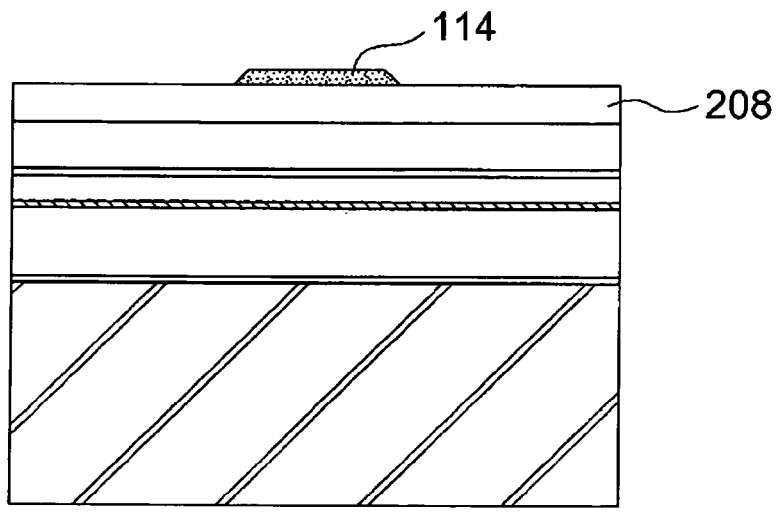
FIGS. 12C and 12D are cross-sectional views showing layer structures in the individual process steps in the fabrication of a conventional semiconductor laser element, as continued from FIG. 11B.
Figure 12D:
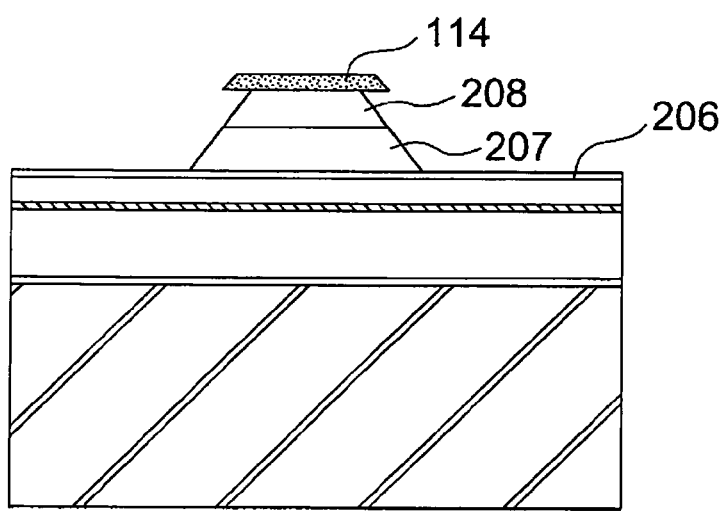
Figure 13E:
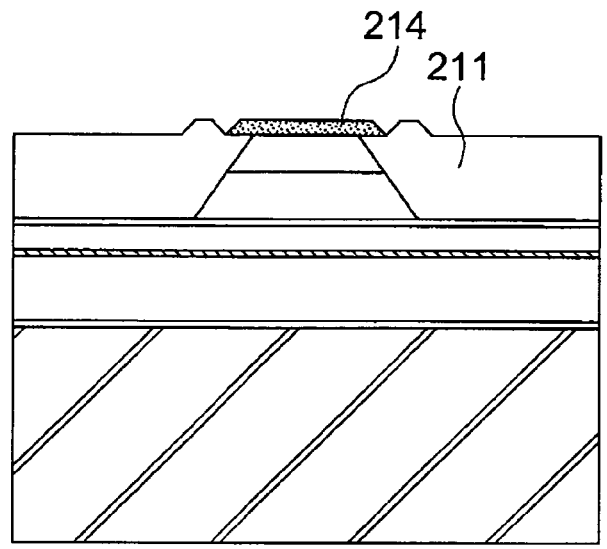
FIGS. 13E and 13F are cross-sectional views showing layer structures in the individual process steps in the fabrication of a conventional semiconductor laser element, as continued from FIG. 12D.
Figure 13F:
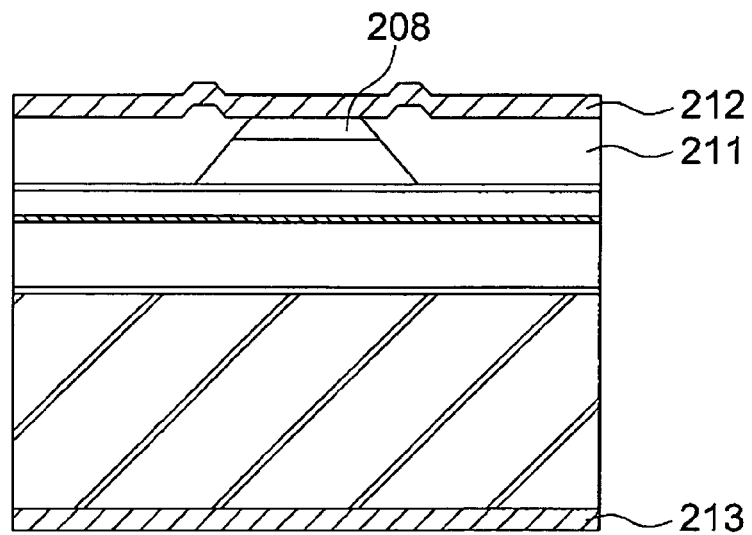

On the other hand, FIG. 8 is a drawing of energy levels of a layer structure of a conventional semiconductor laser of a single-layered cladding layer structure having neither the n-$Al_{0.6}Ga_{0.4}$As cladding layer 103 nor the p-$Al_{0.6}Ga_{0.4}$As third cladding layer 109, which are constituents of the semiconductor laser element 100 of this embodiment.

The layer structure shown in FIG. 8 include a 1-μm thick n-$Al_{0.47}Ga_{0.53}$As cladding layer and an p-$Al_{0.47}Ga_{0.53}$As second cladding layer in place of the n-$Al_{0.6}Ga_{0.4}$As cladding layer 103 and the p-$Al_{0.6}Ga_{0.4}$As third cladding layer 109, and corresponds to a structure of a conventional semiconductor laser element.

This configuration is such as having the n-$Al_{0.47}Ga_{0.53}$As cladding layer and the p-$Al_{0.47}Ga_{0.53}$As cladding layer while placing the active layer in between, but having no additional $Al_{0.6}Ga_{0.4}$As cladding layers, being a lower-refractive-index material, further sandwiching these cladding layers, and has a light confinement factor of 3.1645%. In other words, the conventional semiconductor laser element can achieve a light confinement effect only to a weaker degree as compared with that this example of preferred embodiment of the present invention.

Because the $Al_{0.55}Ga_{0.45}$As etching stop layer 107 in the present embodiment is configured as having the thickness reduced to as thin as 0.015 μm, the refractive index of the etching stop layer 107 becomes less affective to the light generated in the active region, and this successfully reduces influences on the optical characteristics of the semiconductor laser element.

In the present embodiment, difference in the Al compositional ratio between the p-$Al_{0.6}Ga_{0.4}$As third cladding layer 109 and the p-$Al_{0.47}Ga_{0.53}$As second cladding layer 108 is 0.13, and difference in the Al compositional ratio between the $Al_{0.55}Ga_{0.45}$As etching stop layer 107 and the p-$Al_{0.47}Ga_{0.53}$As second cladding layer 108 is 0.08. This facilitates the formation of the stripe-patterned ridge as described in the fabrication method below.

Examples of Preferred Embodiments for the Method of Fabricating a Semiconductor Laser Element This embodiment relates to one exemplary preferred embodiment of a method of fabricating a semiconductor laser element according to the present invention. FIGS. 2A and 2B, FIGS. 3C and 3D, FIGS. 4E and 4F, and FIG. 5 show cross-sectional views of layer structures in the individual process steps in the fabrication of the semiconductor laser element of the above-described embodiment.

First Epitaxial Growth Step

First, as shown in FIG. 2A, the n-GaAs buffer layer 102, the n-$Al_{0.6}Ga_{0.4}$As cladding layer 103, the n-$Al_{0.47}Ga_{0.53}$As cladding layer 104, the active layer section 105, the p-$Al_{0.47}Ga_{0.53}$As first cladding layer 106, the $Al_{0.55}Ga_{0.45}$As etching stop layer 107, the p-$Al_{0.47}Ga_{0.53}$As second cladding layer 108, the p-$Al_{0.6}Ga_{0.4}$As third cladding layer 109, and the p-GaAs contact layer 110 are epitaxially grown sequentially in this order on the n-GaAs substrate 101 in the first epitaxial growth step by an organometallic vapor phase growth process such as the MOVPE process and MOCVD process, to thereby form a stacked structure 116 having a double hetero-structure.

In the epitaxial growth, Si, Se and so forth are used as the n-type dopant, and Zn, Mg, Be and so forth as the p-type dopant.

Ridge Formation Step [Pre-Process]

Figure 2B:
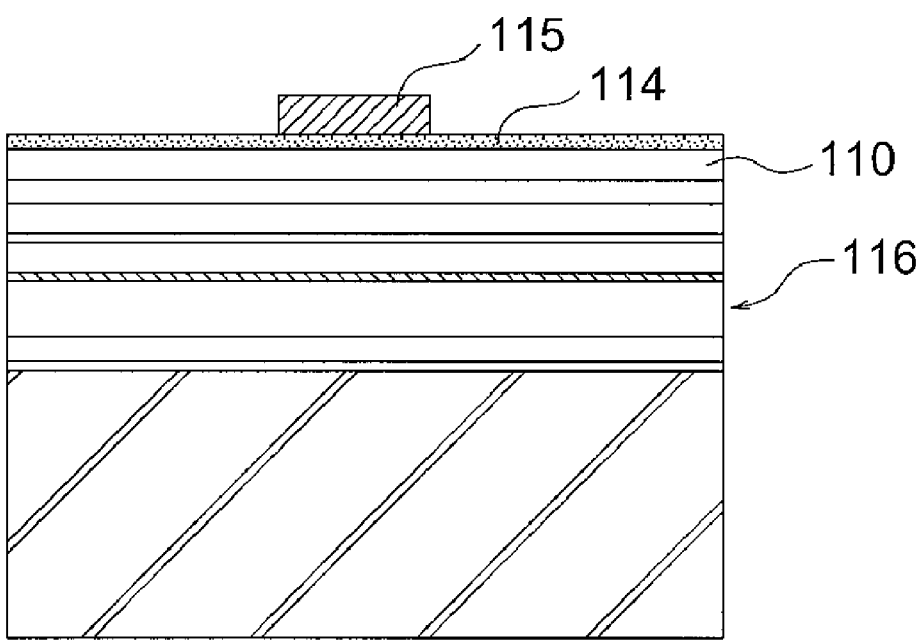

Next, as shown in FIG. 2B, an $SiO_2$ film 114 is formed on the top surface of the stacked structure 116, that is, the upper surface of the p-GaAs contact layer 110, by the CVD (Chemical Vapor Deposition) process or the like, and further on the $SiO_2$ film 114, a stripe-patterned resist mask 115 is formed by photolithography.

Figure 3C:
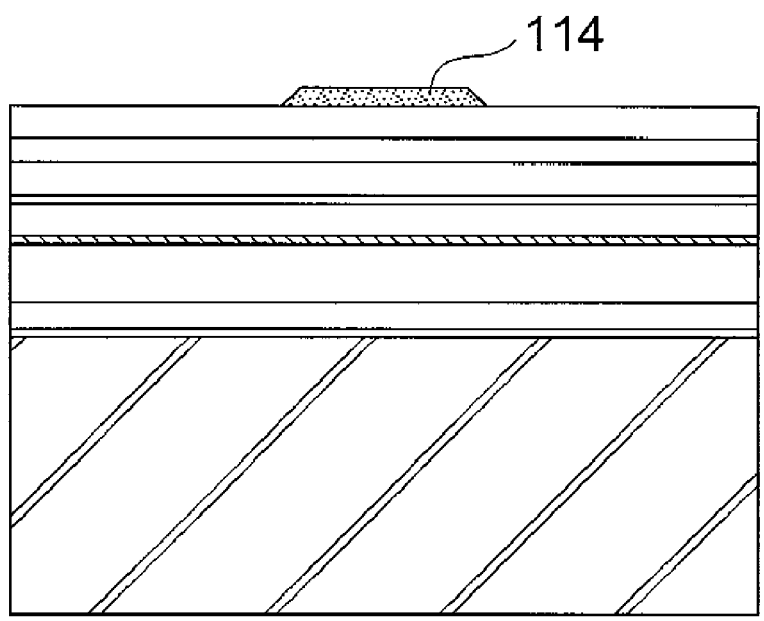
FIGS. 3C and 3D are cross-sectional views showing layer structures in the individual process steps in the fabrication of the semiconductor laser element according to a preferred embodiment of the present invention, as continued from FIG. 2B.

Next, as shown in FIG. 3C, the $SiO_2$ film 114 is patterned by an etching technique using the resist mask 115, to thereby form a stripe-patterned $SiO_2$ mask 114. After the $SiO_2$ mask 114 is formed, the resist mask 115 is removed.

Next, the p-GaAs contact layer 110, the p-$Al_{0.6}Ga_{0.4}$As third cladding layer 109, and the p-$Al_{0.47}Ga_{0.53}$As second cladding layer 108 are etched by a two-step wet etching technique under masking with the $SiO_2$ film 114, to thereby form a stripe-patterned ridge.

[First Wet Etching Step]

Figure 3D:
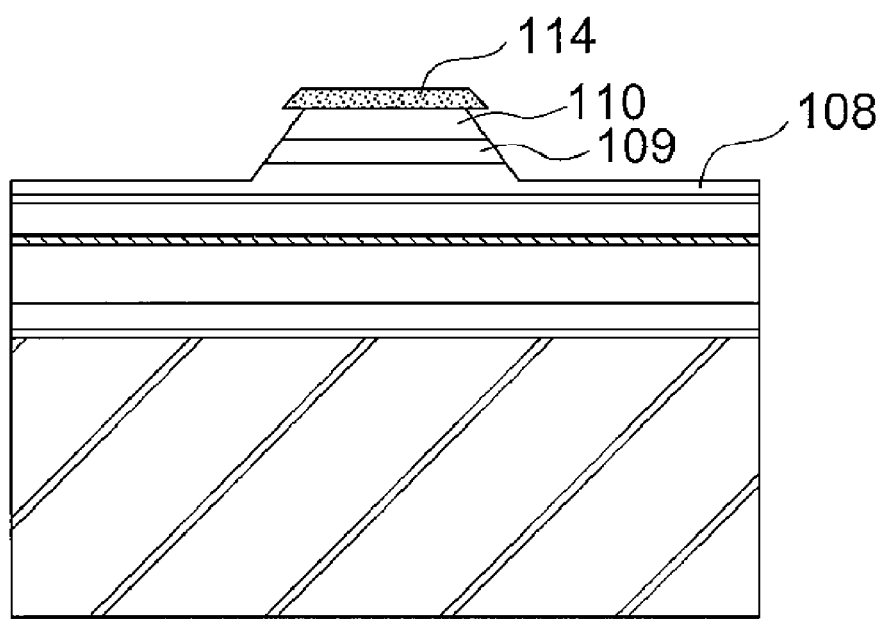

In the first wet etching step, as shown in FIG. 3D, the p-GaAs contact layer 110 is etched typically by using a sulfuric-acid-containing etchant, and then the p-$Al_{0.47}Ga_{0.53}$As second cladding layer 108 is etched so as to terminate the etching in halfway by controlling the etching time, so as to prevent the etching from reaching the $Al_{0.55}Ga_{0.45}$As etching stop layer 107.

It is to be noted that it is very difficult for the sulfuric-acid-containing etchant to ensure an etching selectivity between the p-$Al_{0.47}Ga_{0.53}$As second cladding layer 108 and the $Al_{0.55}Ga_{0.45}$As etching stop layer 107.

A composition of the etchant used in the first wet etching step is sulfuric acid (96%): hydrogen peroxide (31%): water=1:8:40 (in ratio by volume, compositional ratio of the etchant mixed solution will be expressed in ratio by volume unless otherwise specifically noted), and an etching time is set to 2 minutes. By terminating the etching to as long as this duration of time, the p-$Al_{0.47}Ga_{0.53}$As second cladding layer 108 is remained in a thickness of approximately 0.2 μm on the $Al_{0.55}Ga_{0.45}$As etching stop layer 107.

The sulfuric-acid-containing etchant has poor reproducibility and is difficult to secure on-plane uniformity. More specifically, the etchant can etch the p-$Al_{0.47}Ga_{0.53}As$ second cladding layer 108 only with a poor in-plane uniformity, and thereby causes a large in-plane variation in the degree of the etching. If the variation remains uncorrected, the resultant ridges will have heights differing from element to element within the wafer plane, and this will be causative of variations in the difference in the refractive indices and emission angle characteristic. According to this example of preferred embodiment of the present invention, this is solved by the second etching step described later.

After completion of the first etching step, the etched stacked structure is dipped into a cleaning solution containing citric acid monohydrate (50 wt % aqueous solution), without subjecting it to cleaning under running water and drying, and also without disposing it to the air and water, and the cleaning solution is stirred to thereby remove the sulfuric-acid-containing etchant remained on the wafer surface. The stirring time is adjusted to 20 seconds.

The wafer is preferably conveyed while being kept away from the air and water in order to avoid drying and the consequent natural oxidation of the wafer surface.

Next, in order to thoroughly remove the resultant native oxide film on the wafer surface and the residual sulfuric-acid-containing etchant, the wafer is subsequently dipped into another fresh section of the cleaning solution containing citric acid monohydrate (50 wt % aqueous solution), and the cleaning solution is stirred to rinse the wafer. The stirring time is adjusted to 1 minute.

Also when the wafer is transferred to a new cleaning solution, it is preferable to avoid exposure of the wafer surface to the air and water in order to prevent natural oxidation of the wafer surface due to drying. Also cleaning under running water is not desirable.

[Second Wet Etching Step]

Figure 4E:
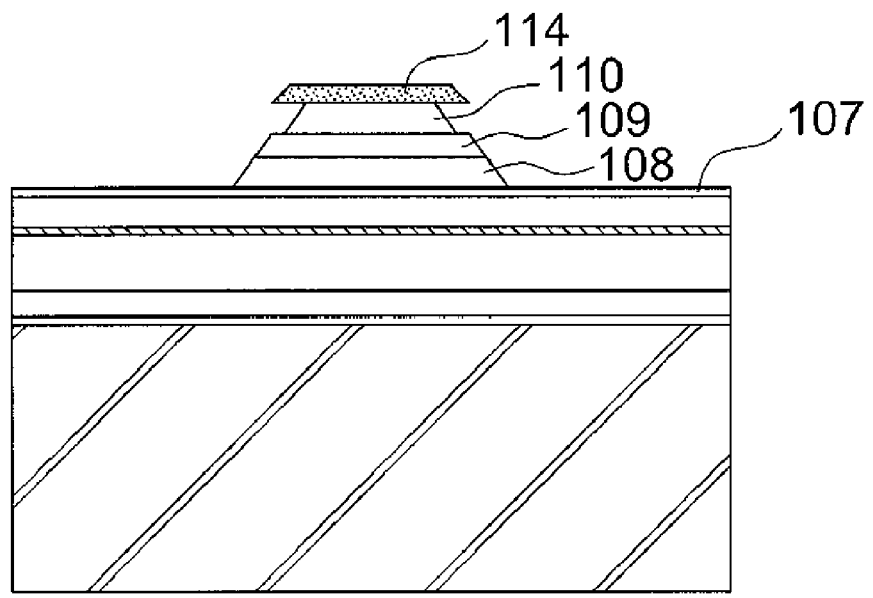
FIGS. 4E and 4F are cross-sectional views showing layer structures in the individual process steps in the fabrication of the semiconductor laser element according to a preferred embodiment of the present invention, as continued from FIG. 3D.

Next, the process advances to a second wet etching step. In the second etching step, a mixed solution of citric acid and an aqueous hydrogen peroxide solution is used as an etchant, and as shown in FIG. 4E, the residual section of the p-$Al_{0.47}Ga_{0.53}As$ second cladding layer 108 is etched to as deep as to reach the $Al_{0.55}Ga_{0.45}As$ etching stop layer 107.

The etchant used in the second etching step is a mixed solution having a compositional ratio of citric acid monohydrate (50 wt % aqueous solution) and an aqueous hydrogen peroxide solution (31%) of 12:1, and the etching time is adjusted to 2 minutes.

The etchant comprising the mixed solution of citric acid and an aqueous hydrogen peroxide solution has an etching selectivity over the $Al_{0.55}Ga_{0.45}As$ etching stop layer 107. That is, the $Al_{0.55}Ga_{0.45}As$ etching stop layer 107 is abruptly oxidized as soon as it is exposed, and reduces its etchrate by the etchant, so that the etching terminates on the etching stop layer 107.

Also when the wafer is transferred to a new cleaning solution, it is preferable to avoid exposure of the wafer surface to the air and water in order to prevent natural oxidation of the wafer surface due to drying. Also cleaning under running water is not carried out.

Figure 6:
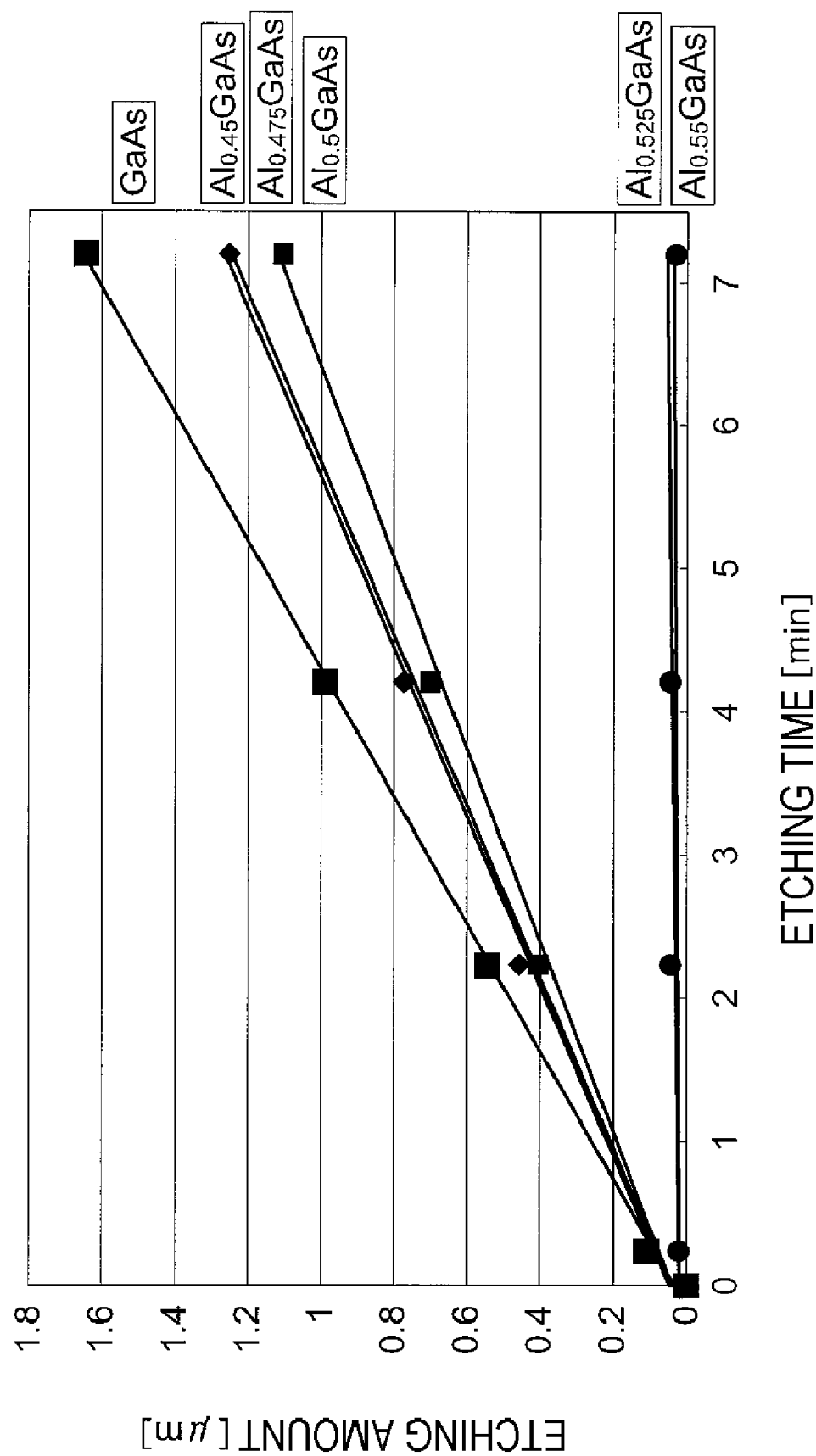
FIG. 6 is a graph showing etch rates of $Al_xGa_{1-x}As$ layers using an etchant comprising a 12:1 mixed solution of citric acid monohydrate (50 wt % aqueous solution) and an aqueous hydrogen peroxide solution (31%)

FIG. 6 is a graph showing etchrates of $Al_xGa_{1-x}As$ layers using an etchant comprising a 12:1 mixed solution of citric acid monohydrate (50 wt % aqueous solution) and an aqueous hydrogen peroxide solution (31%).

The graph has the abscissa representing the etching time [min] and the ordinate representing the amount of etching [μm], where lines from the bottom to the top express etchrates of the AlGaAs layers having an Al compositional ratio "x" of 0.55, 0.525, 0.5, 0.475, 0.45 and 0 (GaApectively.

As it is seen from the graph of FIG. 6, the etchrate increases as the Al compositional ratio decreases, and it was found that a large selectivity can be secured between $Al_{0.5}Ga_{0.5}As$ and $Al_{0.525}Ga_{0.475}As$. This means that an Al compositional ratio of up to 0.5 allows etching to proceed, but an Al compositional ratio of 0.525 prevents the etching from proceeding because Al binds with oxygen in the hydrogen peroxide to form aluminum oxide.

In other words, $Al_{0.5}Ga_{0.5}As$ allows the etching effect to predominantly be expressed, but $Al_{0.525}Ga_{0.475}As$, having an Al compositional ratio of only larger by 0.025, completely inhibits the etching due to a predominant effect of oxidation based on binding of Al with oxygen in hydrogen peroxide.

The use of the above-described etchant is therefore successful in selectively etching the p-$Al_{0.47}Ga_{0.53}As$ second cladding layer 108, and in terminating the etching on the $Al_{0.55}Ga_{0.45}As$ etching stop layer 107.

The etching time necessary for etching the p-$Al_{0.47}Ga_{0.53}As$ second cladding layer 108 having a thickness of approximately 0.2 μm on the $Al_{0.55}Ga_{0.45}As$ etching stop layer 107 can be estimated as 1 minute or around as being judged from the graph shown in FIG. 6, but the actual etching time in the second etching step is adjusted to 2 minutes.

This is because the first etching step using the sulfuric-acid-containing etchant resulted in in-plane variation of the etching as described in the above, and it is necessary to resolve the etching variation in the second etching step by setting the etching time slightly longer than the estimation.

As is known from FIG. 6, GaAs shows a largest etchrate. Therefore as shown in FIG. 4E, the p-contact layer 110 causes an undercut of as deep as approximately 0.2 μm under the $SiO_2$ mask 114.

As is also known from FIG. 6, the p-$Al_{0.6}Ga_{0.4}As$ third cladding layer 109 cannot be etched by the etchant used in the second etching step of this reason, the first etching step adopts the sulfuric-acid-containing etchant so as to allow the etching to proceed to as far as to reach the p-$Al_{0.47}Ga_{0.53}As$ second cladding layer 108.

In the ridge formation by the etching in the present embodiment, it is essential to keep the wafer surface away from the air and water. This is because AlGaAs can readily oxidize when exposed to an atmosphere such as water or the air, and this outermost oxide film immediately inhibits the etching, to thereby cause clouding or non-uniformity in the etching.

Second Epitaxial Growth Step

Figure 4F:
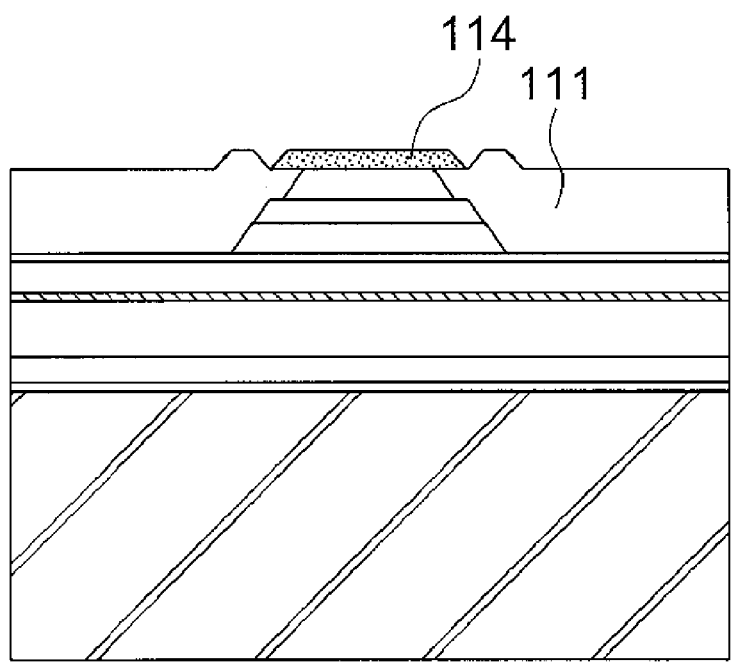

Next, as shown in FIG. 4F, in the second epitaxial growth step, the n-GaAs current blocking layer 111 is selectively grown on both lateral faces and both lateral sections of the ridge under masking with the $SiO_2$ mask 114.

The n-GaAs current blocking layer 111 is grown on the lateral faces and both lateral sections of the ridge, but is not grown on the $SiO_2$ mask 114.

Electrode Formation Step

Figure 5:
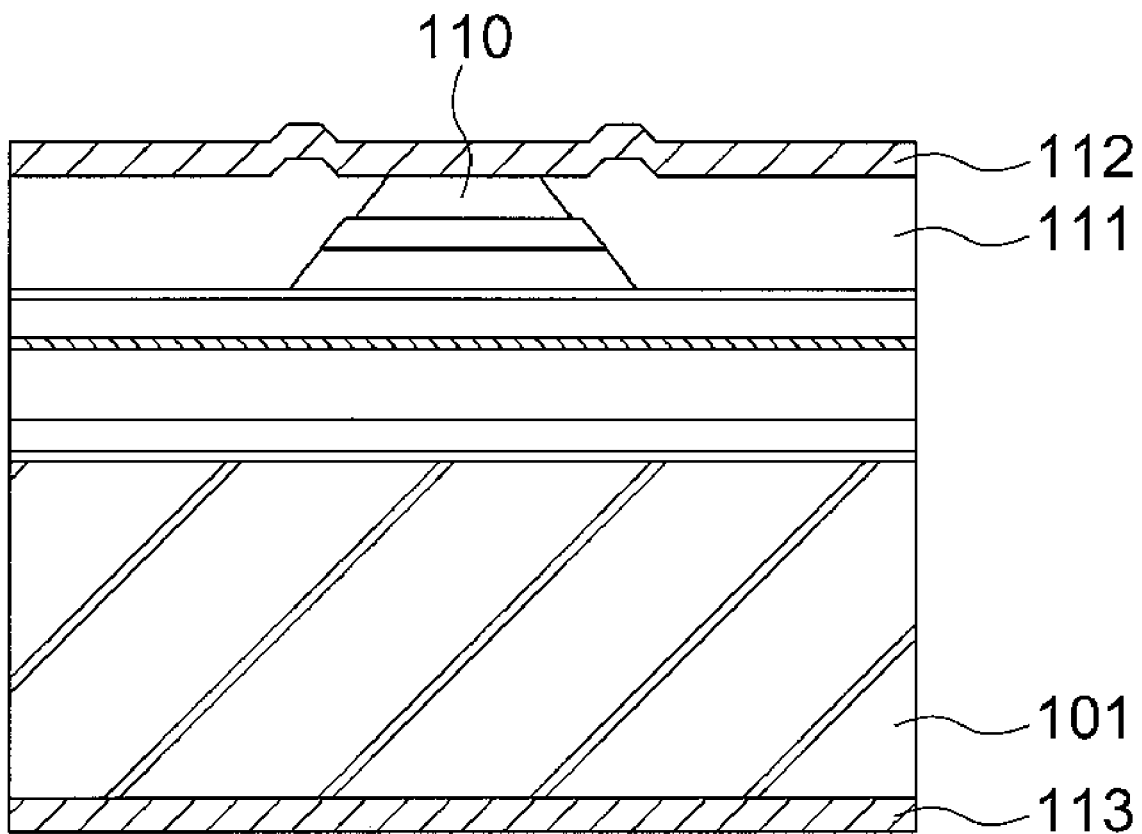
FIG. 5 is a cross-sectional view showing layer structure in a process step in the fabrication of the semiconductor laser element according to a preferred embodiment of the present invention, as continued from FIG. 4F.

Next, as shown in FIG. 5, the $SiO_2$ mask 114 is removed, the p-side electrode 112 is formed on the p-GaAs contact layer 110 and the n-GaAs current blocking layer 111, and the n-side electrode 113 is formed on the back surface of the n-GaAs substrate 101.

A semiconductor wafer for fabricating the laser elements, of which layer structure previously shown in FIG. 1, is thus obtained.

The semiconductor wafer for fabricating the laser elements is then cleft along the direction normal to the stripe-patterned ridge to thereby fabricate the semiconductor laser element having a pair of reflective surfaces for composing an oscillator.

Although a difference in the Al compositional ratio between the p-$Al_{0.47}Ga_{0.53}As$ second cladding layer 108 and the $Al_{0.55}Ga_{0.45}As$ etching stop layer 107 is only as small as 0.08 in the semiconductor laser element 100 of this embodiment, the use of the citric-acid-containing etchant specified in the present invention can successfully secure an advantageous level of the etching selectivity therebetween, and facilitates the ridge formation.

On the other hand, because the Al compositional ratio of the etching stop layer 107 is as large as 0.55, carrier recombination within the etching stop layer 107 is suppressed, and this makes it possible to realize a semiconductor laser element having a low element resistance and a low operational voltage.

The use of AlGaAs for composing the etching stop layer also makes it possible to grow this layer in the first epitaxial growth step without changing the growth temperature. This is successful in readily forming the stacked structure 116 within a short period of time, and in fabricating the semiconductor laser element at low coasts.

The fabrication method according to a preferred embodiment of the present invention uses two or more types of etchant including a mixed solution of an aqueous citric acid solution and an aqueous hydrogen peroxide solution for the ridge formation, and never disposes the wafer to the air during the ridge formation, so that the wafer is successfully prevented from being naturally oxidized and allows a highly reproducible etching process to proceed without causing clouding of the surface thereof and non-uniformity in the etching.

Although the difference in the Al compositional ratio between the $Al_{0.55}Ga_{0.45}As$ etching stop layer 107 and the p-$Al_{0.47}Ga_{0.53}As$ second cladding layer 108 was adjusted to 0.08 according to this example of preferred embodiment of the present invention, these values are not specifically limited provided that the difference in the Al compositional ratio is adjusted to 0.025 or larger, and the compositional ratio of citric acid monohydrate (50 wt % aqueous solution) and an aqueous hydrogen peroxide solution (31%) is adjusted so as to ensure the etching selectivity.

For example, it is known from FIG. 9 that use of an etchant which comprises an 11:1 mixed solution of citric acid monohydrate (50 wt % aqueous solution) and an aqueous hydrogen peroxide solution (31%) can successfully ensure a large etching selectivity between $Al_{0.475}Ga_{0.525}As$ and $Al_{0.5}Ga_{0.5}As$.

FIG. 9 shows a graph showing etchrates of $Al_xGa_{1-x}As$ layers using an etchant comprising an 11:1 mixed solution of citric acid monohydrate (50 wt % aqueous solution) and an aqueous hydrogen peroxide solution (31%), where the abscissa represents the etching time [min] and the ordinate represents the amount of etching [μm], and lines from the bottom to the top express etchrates of the AlGaAs layers having an Al compositional ratio "x" of 0.55, 0.525, 0.5, 0.475, 0.45 and 0 (GaAs), respectively.

Although the n-GaAs current blocking layer 111 is grown on the oblique faces and both lateral sections of the ridge so as to bury the ridge, the ridge may be formed into any other geometries depending on the design of wave-guiding mechanism.

Although the present example has a structure in which the $Al_{0.55}Ga_{0.45}As$ etching stop layer 107 remains in the lateral portion of the ridge, it is also possible to remove the layer.

Although the p-$Al_{0.47}Ga_{0.53}As$ first cladding layer 106 and p-$Al_{0.47}Ga_{0.53}As$ second cladding layer 108 have the same Al compositional ratio in this example of preferred embodiment of the present invention, the ratio may differ from each other. It is still also allowable that the Al compositional ratio of the p-$Al_{0.47}Ga_{0.53}As$ first cladding layer is adjusted so as to allow the layer to serve also as the etching stop layer, or the layer may be identical to the etching stop layer.

The substrate is not specifically limited to the n-GaAs substrate as described in the above, and of course may be a p-GaAs substrate.

Therefore, although the preferred embodiments of the present invention have been described above in their preferred forms with a certain degree of particularity, it should be understood by those of ordinary skill in the art that that the present invention is not limited thereto and that needless to say, other various modifications, variations, combinations and sub-combinations of such embodiments and equivalents thereof may be made without departing from the scope and spirit of the present invention.

What is claimed is:

1. A method of fabricating an AlGaAs-based ridge-stripe semiconductor laser element comprising the steps of:
    forming a stacked structure on an active layer section, said stacked structure comprising
        an $Al_xGa_{1-x}As$ (0<x<1) first cladding layer,
        an $Al_zGa_{1-z}As$ (0<z≦1) etching stop layer,
        an $Al_xGa_{1-x}As$ (0<x<1) second cladding layer,
        an $Al_yGa_{1-y}As$ (0<y<1) third cladding layer, and
        a GaAs contact layer,
        said etching stop layer being in contact with said first cladding layer and said second cladding layer, and having Al compositional ratio "z" of said etching stop layer, Al compositional ratio "x" of said first cladding layer and said second cladding layer, and Al compositional ratio "y" of said third cladding layer satisfying the relations x<z and x<y, where a difference between "x" and "z" is set to 0.025 or more; and
    forming a stripe-patterned ridge by wet-etching said contact layer, said third cladding layer and said second cladding layer,
    wherein,
    said ridge forming step further comprises:
        a first etching step of wet-etching part of said contact layer, said third cladding layer, and said second cladding layer; and
        a second etching step of etching the residual portion of said second cladding layer up to said etching stop layer, by using an etchant comprising a mixed solution of an aqueous citric acid solution and an aqueous hydrogen peroxide solution.

2. The method of fabricating a semiconductor laser element as claimed in claim 1, further comprising a step of cleaning said stacked structure etched in said first etching step using an aqueous citric acid solution, between said first etching step and said second etching step.

3. The method of fabricating a semiconductor laser element as claimed in claim 2, wherein said stacked structure etched in said first etching step is transferred from said first etching step through said cleaning step to said second etching step without further exposure to water and exposure to air so as to minimize natural oxidation of the wafer surface due to drying.

4. The method of fabricating a semiconductor laser element as claimed in claim 1, wherein a thickness of the etching stop layer is 0.015 pm.

5. The method of fabricating a semiconductor laser element as claimed in claim 4, wherein the thickness of the etching stop layer is within a range of 0.015 μm and 0.02 μm.

6. The method of fabricating a semiconductor laser element as claimed in claim 1, wherein the difference between "y" and "x" is 0.13, and wherein the difference between "z" and "x" is 0.08.

7. The method of fabricating a semiconductor laser element as claimed in claim 1, wherein the stacked structure is expitaxially grown sequentially on the active layer section.

8. The method of fabricating a semiconductor laser element as claimed in claim 1, wherein the mixed solution includes 50 percent aqueous citric acid solution and 31 percent aqueous hydrogen peroxide solution to ensure etching sensitivity.

9. The method of fabricating a semiconductor laser element as claimed in claim 1, wherein a thickness of the first cladding layer is 0.3 μm, a thickness of the second cladding layer is 0.03 μm, a thickness of the third cladding layer is 1.0 μm, and a thickness of the contact layer is 0.5 μm.

* * * * *